(12) United States Patent
Oden et al.

(10) Patent No.: US 9,864,188 B2
(45) Date of Patent: Jan. 9, 2018

(54) OPERATION/MARGIN ENHANCEMENT FEATURE FOR SURFACE-MEMS STRUCTURE; SCULPTING RAISED ADDRESS ELECTRODE

(71) Applicant: Texas Instruments Incorporated, Dallas, TX (US)

(72) Inventors: Patrick I. Oden, McKinney, TX (US); James C. Baker, Coppell, TX (US); Sandra Zheng, Allen, TX (US); William C. McDonald, Allen, TX (US); Lance W. Barron, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 174 days.

(21) Appl. No.: 14/531,842

(22) Filed: Nov. 3, 2014

(65) Prior Publication Data

US 2016/0124302 A1    May 5, 2016

(51) Int. Cl.
*G03F 7/20* (2006.01)
*G02B 26/08* (2006.01)
*B81B 3/00* (2006.01)

(52) U.S. Cl.
CPC ........... *G02B 26/0841* (2013.01); *B81B 3/00* (2013.01)

(58) Field of Classification Search
CPC .................. G02B 26/0833; G02B 26/0841
USPC ......................................................... 430/329
See application file for complete search history.

(56) References Cited

U.S. PATENT DOCUMENTS

| 6,552,840 | B2 | 4/2003 | Knipe |
| 7,365,898 | B2 | 4/2008 | Gong et al. |
| 7,466,476 | B2 | 12/2008 | Mangrum |
| 7,764,418 | B2 | 7/2010 | Mangrum |
| 2002/0071171 | A1* | 6/2002 | Greywall ........... G02B 26/0841 359/292 |

OTHER PUBLICATIONS

K. Reimer et al., "16 K Infrared Micromirror Arrays with Large Beam Deflection and Tenth Millimeter Pexel Size", Fraunhofer Institute Silicon Technonogy (ISIT), 9 pgs.
K. Reimer, et al., "One-Level gray-tone lithography—mask data preparation and pattern transfer", Fraunhofer Institute Silicon Technonogy (ISIT) SPIE vol. 2783/71, 9 pgs.
Wagner, et al.; "Infrared Micromirror Array with Large Pixel Size and Large Deflection Angle"; Fraunhofer Institute for Silicon Technology; 1997 International Conference on Solid-State Sensors and Actuators; Chicago; Jun. 16-19, 1997; pp. 75-78.
Gregory T.A. Kovacs; "Micromachined Transducers Sourcebook"; Stanford University; WCB McGraw-Hill; 1998; pp. 472.

* cited by examiner

*Primary Examiner* — Daborah Chacko Davis
(74) *Attorney, Agent, or Firm* — Michael A. Davis, Jr.; Charles A. Brill; Frank D. Cimino

(57) ABSTRACT

A method of forming a micro-electromechanical systems (MEMS) pixel, such as a DMD type pixel, by forming a substrate having a non-planar upper surface, and depositing a photoresist spacer layer upon the substrate. The spacer layer is exposed to a grey-scale lithographic mask to shape an upper surface of the spacer layer. A control member is formed upon the planarized spacer layer, and an image member is formed over the control member. The image member is configured to be positioned as a function of the control member to form a spatial light modulator (SLM). The spacer layer is planarized by masking a selected portion of the spacer layer with a grey-scale lithographic mask to remove binge in the selected portion.

20 Claims, 12 Drawing Sheets

OPERATION/MARGIN ENHANCEMENT FEATURE FOR SURFACE-MEMS STRUCTURE; SCULPTING RAISED ADDRESS ELECTRODE

TECHNICAL FIELD

This disclosure relates generally to semiconductor microelectromechanical systems (MEMS) technology, and more particularly to spatial light modulators (SLMs).

BACKGROUND

Semiconductor spatial light modulators (SLMs) are suitable for digital imaging applications, including projectors, televisions, printers, and other technology. A DIGITAL MICROMIRROR DEVICE (DMD) is a type of SLM invented in 1987 at TEXAS INSTRUMENTS INCORPORATED of Dallas, Tex. The DMD is a monolithic semiconductor device based on micro-electromechanical systems (MEMS) technology. The DMD generally comprises an area array of bi-stable movable micromirrors forming picture elements (pixels) fabricated over an area array of corresponding addressing memory cells and associated addressing electrodes disposed under the micromirrors. The addressing electrodes are selectively energized by a control circuit with a voltage potential to create an electrostatic attraction force causing the respective micromirrors to tilt towards the respective address electrode. In some applications, the micromirror may be provided with a voltage potential as well. One embodiment of a DMD is disclosed in U.S. Pat. No. 7,011,015 assigned to the same assignee of the present disclosure, the teachings of which are incorporated herein by reference.

The monolithic nature of the design and build of the DMD pixel technology is associated with quasi-planar structures interacting electrostatically with the tilting micromirrors. This presents a problem with the ability to shrink structures while attempting to maintain electrostatic entitlement. In the end, the design becomes more and more sensitive to electrostatic torque delivery originating from the edges of planar members and all the variations that this can create.

The fabrication of the above-described DMD superstructure typically uses a CMOS-like process with a completed SRAM memory circuit. Through the use of multiple photomask layers, the superstructure is formed with alternating layers of aluminum for the address electrodes, hinges, spring tips, mirror layers, and hardened photoresist for sacrificial layers that form air gaps. The memory circuit may have a quasi-planar topography, and thus the quasi-planar topography may couple through the photoresist sacrificial layers and form quasi-planar structures.

Topography coupling of one layer to another layer during the monolithic fabrication of a semiconductor device, such as but not limited to layer topography coupling through a sacrificial photoresist spacer layer is expressed through how its shape is locked into place by a metal deposition which is sub sequentially shaped into a member. This member is defined as the 'binge' and the non-uniformity of it and other members, such as address electrodes and spring tips, has impact to the electrostatic torque delivery for actuation.

SUMMARY

This disclosure provides an operation/margin enhancement feature for a surface-MEMS structure including sculpting a raised address electrode.

In a first example embodiment, a method comprises depositing a photoresist spacer layer upon a non-planar upper surface of a substrate. The spacer layer is exposed to a grey-scale lithographic mask to shape an upper surface of the spacer layer. A control member is formed upon the shaped upper surface, and an image member is formed over the control member. The image member is configured to be positioned as a function of the control member to form a spatial light modulator (SLM).

In some embodiments, the spacer layer upper surface is planarized by masking a selected portion of the spacer layer with a grey-scale lithographic mask to remove binge in the selected portion. The image member is parallel to the control member, and the control member is elevated above and parallel to the substrate. The substrate may include memory configured to control the position of the image member. The image member has a light reflective upper surface formed on a torsion hinge and is configured to modulate incident light and form an image.

In another example embodiment, a method comprises depositing a spacer layer upon a non-planar upper surface of a substrate, and exposing the spacer layer to a grey-scale lithographic mask to remove binge in an upper surface of the spacer layer. A positionable image member is formed over the substrate, wherein the image member is configured to be positioned as a function of the control member to form a spatial light modulator (SLM).

In some embodiments, the spacer layer upper surface is planarized by the grey-scale lithographic mask, and the image member is parallel to the substrate. The substrate includes memory configured to control a position of the image member. The image member has a light reflective upper surface configured to modulate incident light and is formed on a torsion hinge. A control member is elevated above the substrate and positioned below the image member.

In another example embodiment, a method comprises depositing a photoresist spacer layer upon a non-planar upper surface of a substrate including memory, and exposing the spacer layer to a grey-scale lithographic mask to planarize an upper surface of the spacer layer. A control member is formed upon the planarized upper surface, and a positionable image member is formed over the control member, wherein the image member is parallel to the control member and configured to be positioned as a function of the memory to form a spatial light modulator (SLM). The image member has a light reflective upper surface configured to modulate incident light and form an image, and is formed on a torsion hinge.

Other technical features may be readily apparent to one skilled in the art from the following figures, descriptions, and claims.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

FIGS. 1 through 23, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
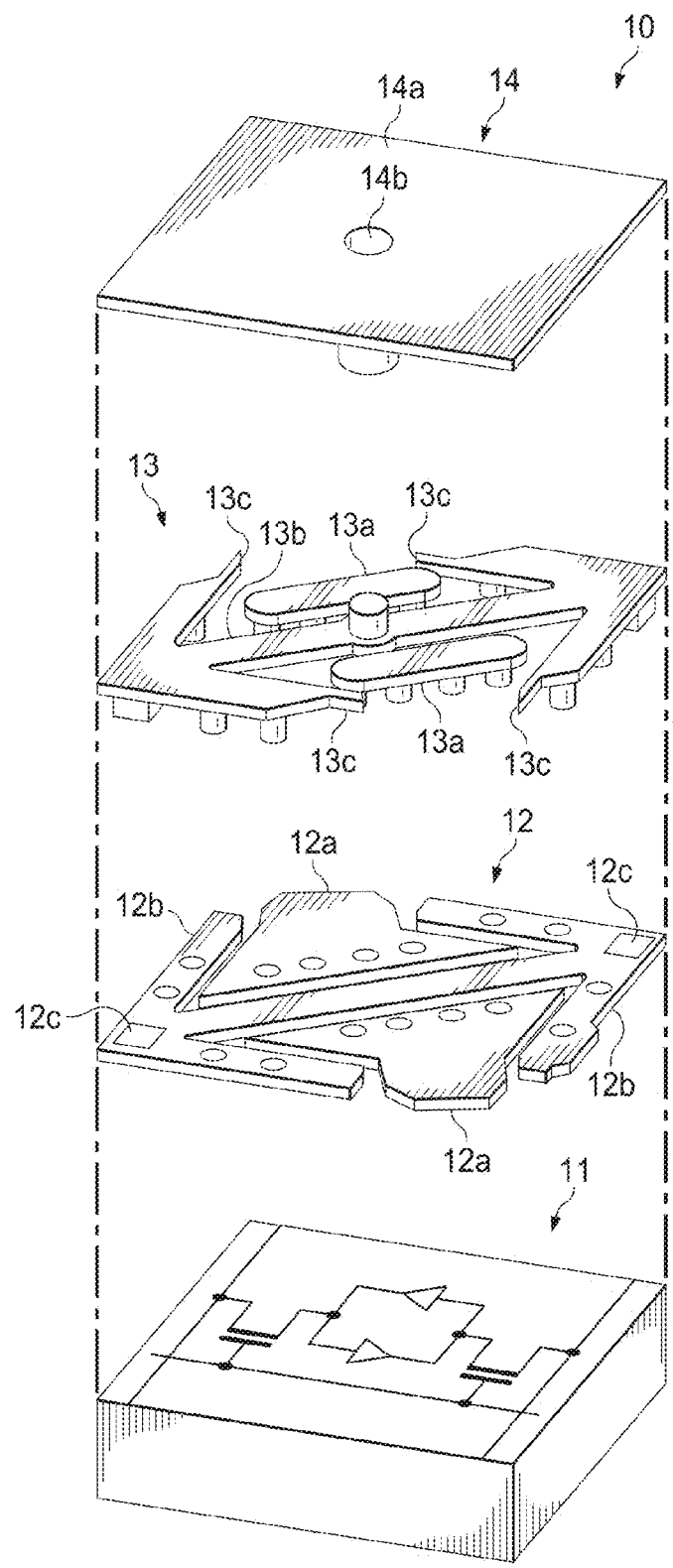
FIG. 1 illustrates an exploded view of a MEMS pixel element in accordance with this disclosure.

FIG. 1 is an exploded view of a pixel element 10, shown in this example embodiment as a DMD pixel. Pixel element 10 is one of an array of such pixel elements fabricated on a wafer (substrate), using semiconductor fabrication techniques. Pixel element 10 is a monolithically integrated MEMS superstructure cell fabricated over a SRAM memory cell 11 formed on the wafer. Two sacrificial photoresist layers have been removed by plasma etching to produce air gaps between three metal layers of the superstructure. For purposes of this description, the three metal layers are "spaced" apart by being separated by these air gaps.

The uppermost first metal (M3) layer 14 has a reflective mirror 14a. The air gap under the mirror 14a frees the mirror 14a to rotate about a compliant torsion hinge 13b, which is part of the second metal (M2) layer 13. Mirror 14a is supported on torsion hinge 13b by a via 14b. Elevated address electrodes 13a also form part of the M2 layer 13 and are positioned under mirror 14a. A third metal (M1) layer 12 has address electrodes 12a for the mirror 14a formed on the wafer, the address electrodes 12a and 13a each being connected to and driven with a voltage potential by memory cell 11. The M1 layer 12 further has a bias bus 12b which electrically interconnects the mirrors 14a of all pixels 10 to bond pads 12c at the chip perimeter. An off-chip driver (not shown) supplies the bias waveform necessary to bond pads 12c for proper digital operation.

The mirrors 14a may each be 7.4 μm square and made of aluminum for maximum reflectivity. They are arrayed on 8 μm centers to form a matrix having a high fill factor (~90%). Other dimensions of the mirrors 14a may be provided depending on the application. The high fill factor produces high efficiency for light use at the pixel level and a seamless (pixelation-free) projected image. The hinge layer 13 under the mirrors 14a permits a close spacing of the mirrors 14a. Because of the underlying placement of the hinges 13b, an array of pixel elements 10 is referred to as a "hidden hinge" type DMD architecture.

In operation, electrostatic fields are developed between the mirror 14a and its address electrodes 12a and 13a, creating an electrostatic torque. This torque works against the restoring torque of the hinge 13b to produce mirror rotation in a positive or negative direction. The mirror 14a rotates until it comes to rest (or lands) against spring tips 13c, which are part of the hinge layer 13. These spring tips 13c are attached to the underlying address layer 12, and thus provide a stationary but flexible landing surface for the mirror 14a.

Figure 2A:
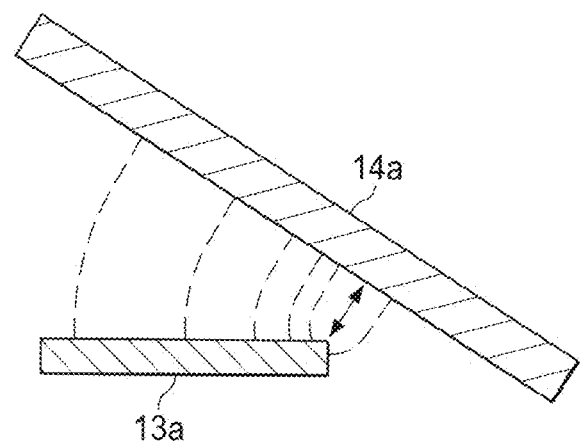
FIG. 2A, FIG. 2B and FIG. 2C illustrate three primary considerations with a tilted MEMS pixel.
Figure 2B:
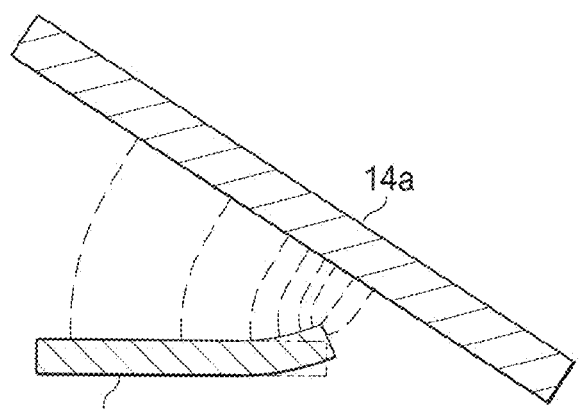
Figure 2C:
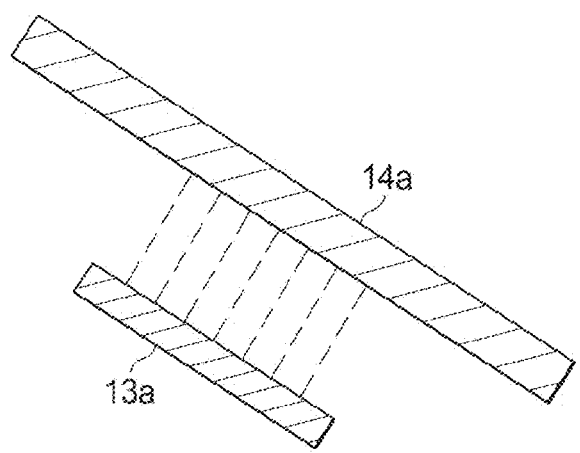

FIG. 2A, FIG. 2B and FIG. 2C illustrate three primary considerations with a tilted MEMS pixel 10 and the electrostatic considerations present. FIG. 2A shows a theoretical electrostatic distribution between the elevated address electrode 13a and the mirror 14a. As shown in FIG. 2B, upward curl is a commonplace condition with the quasi-planar elevated address electrodes 13a which gives additional edge sensitivities. Ideally, it is desired to have a uniform total distribution of the electrostatic field (and force/torque) across the elevated address electrode 13a as shown in FIG. 2C.

Adding to the differential stress of the M2 layer, additional curl results in address electrodes 13a and spring tips 13c due to topography coupling in layer 12 through the first sacrificial photoresist spacer layer 15 (FIG. 4), referred to as "binge". Chemical mechanical planarization (CMP) cannot be acted on the binge in the photoresist. Furthermore, because of the gaps between electrodes 12a, the photoresist will fill partially. This non-uniformity is what creates the topography variations.

Figure 3:
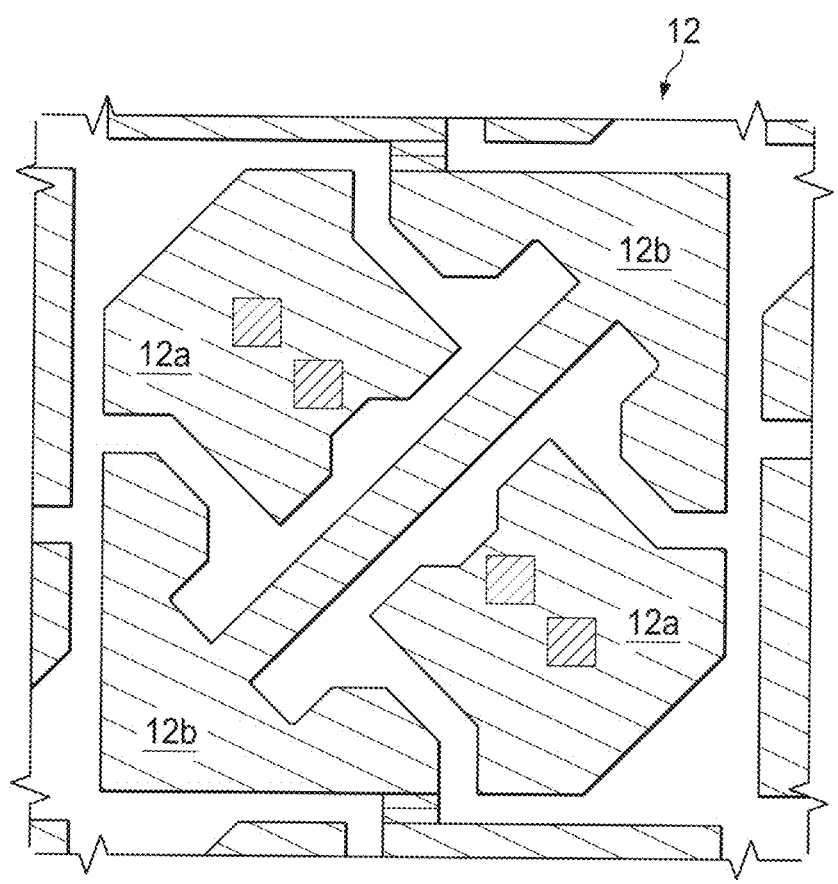
FIG. 3 illustrates an example embodiment of the M1 layer including the address electrode and the bias bus formed on the memory cell.
Figure 4:
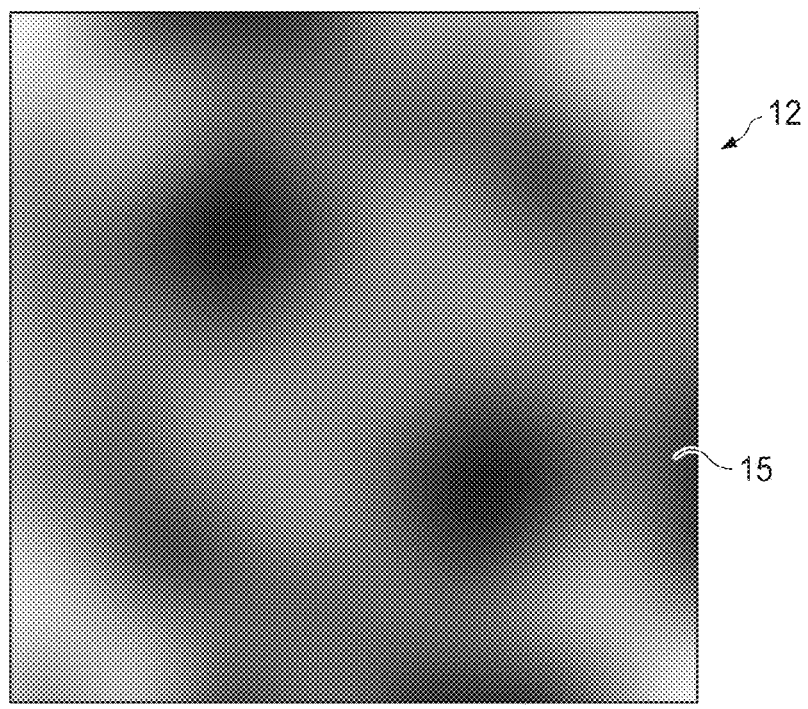
FIG. 4 illustrates an image of the top of the first sacrificial photoresist spacer layer when processed over the M1 layer.

FIG. 3 shows an example embodiment of the M1 layer including the address electrode 12a and the bias bus 12b formed on the memory cell 11. FIG. 4 is an image of the top of the first sacrificial photoresist spacer layer 15 when processed over M1 layer 12. The high features, shown in black in this grey-scale image, show a mounding feature in spacer layer 15 forming the binge over the address electrode 12a.

Figure 5:
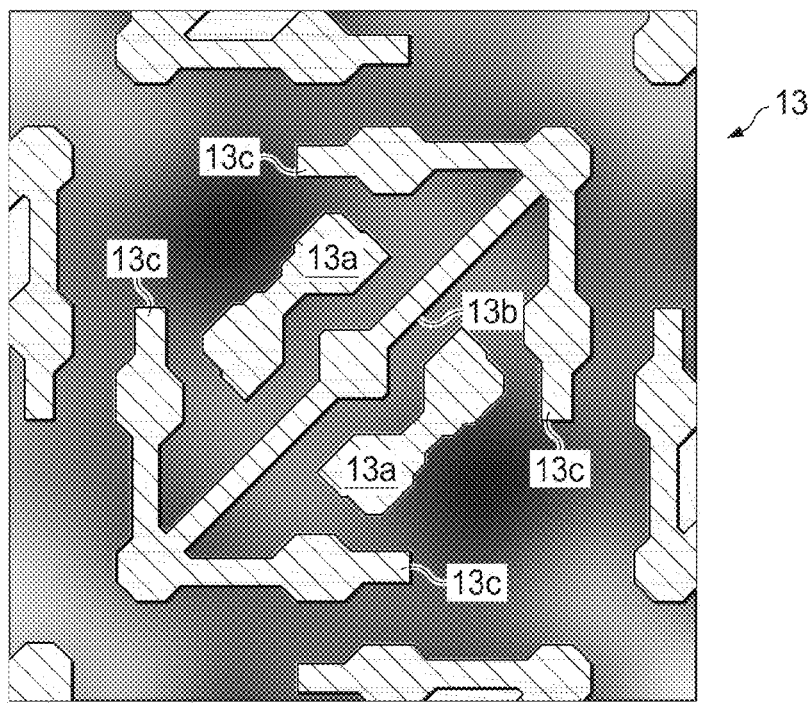
FIG. 5 illustrates the M2 layer including the elevated address electrodes, hinge and spring tips superimposed on top of the photoresist topography shown in FIG. 4.

FIG. 5 shows the M2 layer 13 including the elevated address electrodes 13a, hinge 13b and spring tips 13c superimposed on top of the photoresist topography shown in FIG. 4, with the notable binge at the outer edge of the elevated address electrodes 13a (with respect to the hinge 13b). The binge over the address electrodes 12a consequently causes a binge in the associated elevated address electrodes 13a and spring tips 13c which are processed over the binge, also referred to as curling.

Figure 6:
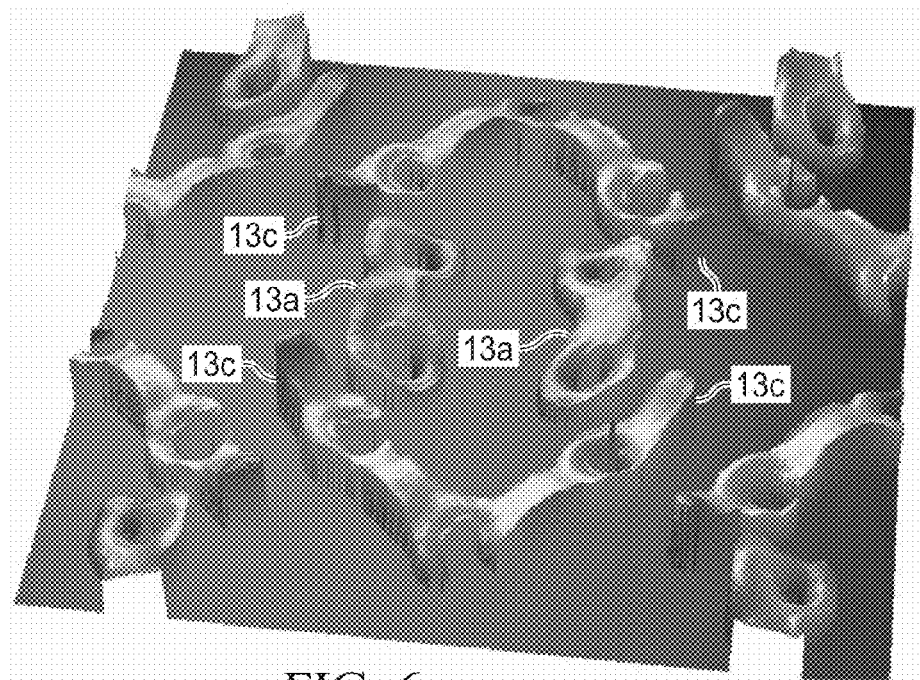
FIG. 6 shows a high-resolution, optical interferometer capture of a 7.6 μm DMD pixel specifically looking at the M2 level, showing a significant amount of curling in the elevated address electrodes and the spring tips.
Figure 7:
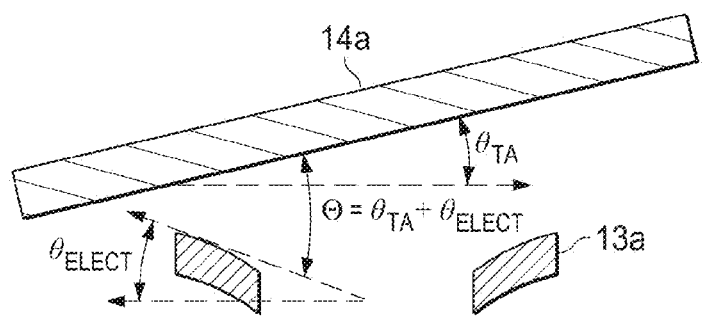
FIG. 7 illustrates curling in the elevated address electrode reducing the combined angle between the mirror and the elevated address electrodes.
Figure 7:
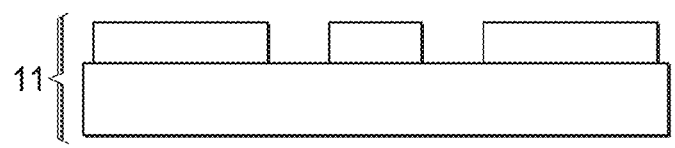

FIG. 6 shows a high-resolution, optical interferometer capture of a 7.6 μm DMD pixel specifically looking at the M2 level 13. There is a significant amount of curling in the elevated address electrodes 13a and the spring tips 13c, each which may curl about 2.5 degrees. Scale in this image is exaggerated to show the degree to which the elevated address electrodes 13a and as well as the spring tips 13c are canted in the opposite direction and act to degrade the electrostatic efficiency of the elevated address electrodes 13a. The curling diminishes the gap between the mirror 14a and the adjacent elevated address electrodes 13a during dynamic operation. This is a common location for marginality of the pixel 10 design and is directly correlated to bias destruct and operational space margin. This curling reduces the combined angle between the mirror 14a and the elevated address electrodes 13a to about 14.5 degrees, as shown in FIG. 7. This undesirably gives significant sensitivity to the specific shapes of these address electrode edges to the electrostatic torque delivery and thereby operation and margin of the pixel.

According to this disclosure, the undulations or thickness variations in the spacer layer 15 (FIG. 4) formed over the address electrodes 12a and the bias bus 12b are removed using a sub-wavelength grey-scale lithography masking process. This sub-wavelength grey-scale lithography masking process advantageously shapes and planarizes the spacer layer 15 before further processing to remove the binge in the spacer layer 15. Consequently, by removing the thickness variations from the selected portion of the spacer layer 15, curling of the elevated address electrodes 13a and spring tips 13c is eliminated. The elevated address electrodes 13a and spring tips 13c are planar and parallel to the mirror 14a positioned above. This sub-wavelength grey-scale lithography masking process is also used on the top of the spacer layer 15 so as to specifically impact the outward edges (referenced against the hinge 13b) of the elevated address electrodes 13a.

Figure 8:
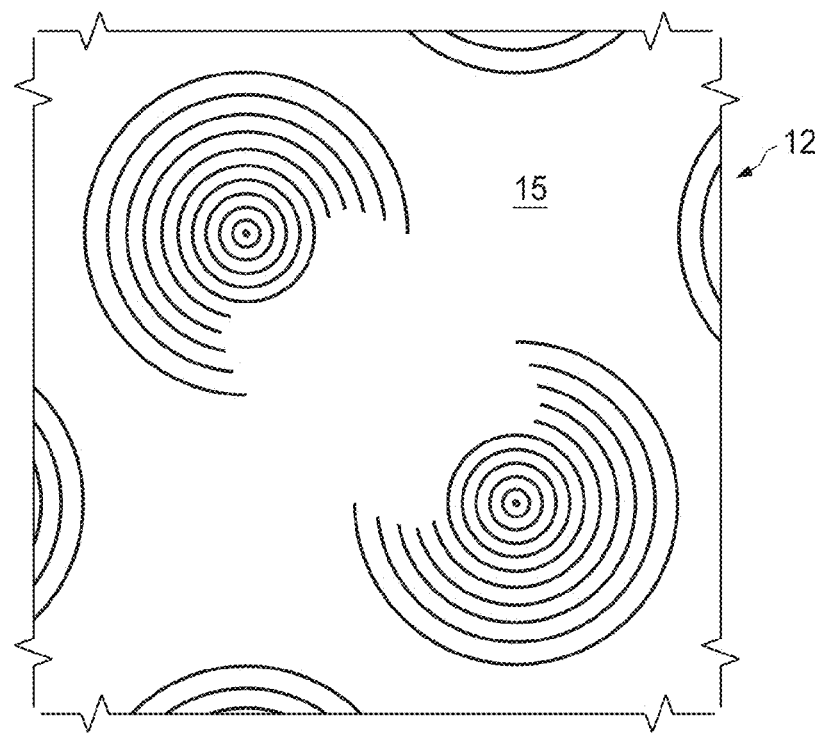
FIG. 8 and FIG. 9 illustrate one example embodiment of a sub-wavelength grey-scale lithography masking process used on the top of a spacer layer so as to specifically impact the outward edges of the elevated address electrodes, according to this disclosure.
Figure 9:
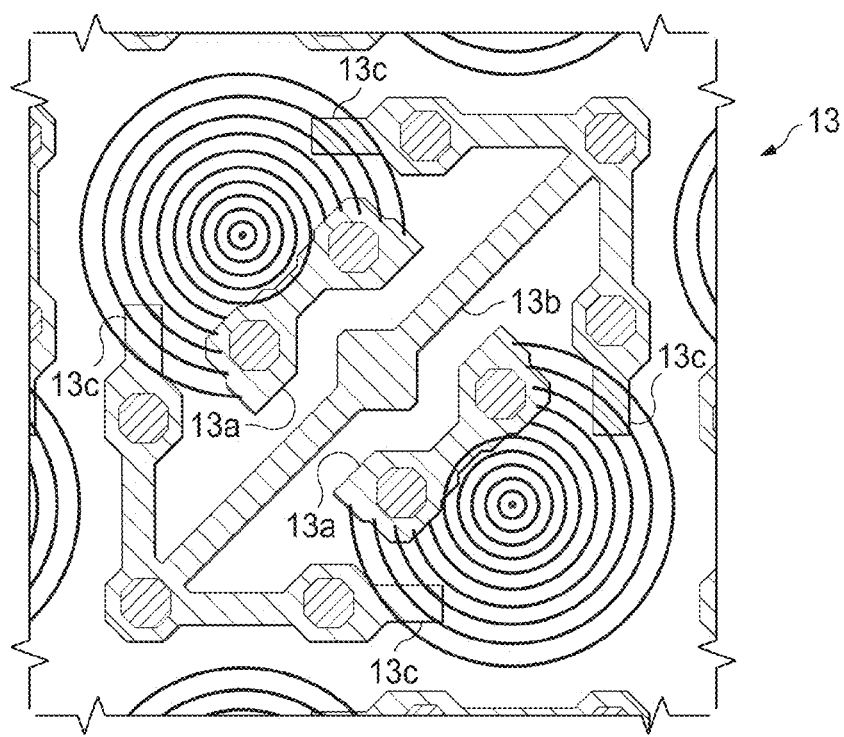

FIG. 8 and FIG. 9 illustrate the sub-wavelength grey-scale lithography masking process according to this disclosure. The variations of thickness in spacer layer 15 (which is set by the spacer coverage over underlying patterned surface) is selectively acted upon and targeted, as represented by the concentric rings shown in FIG. 8 and FIG. 9, to sculpt the spacer layer 15 and remove this variation, and therefore, create a planar (or possibly tapered downward) upper surface of spacer layer 15 before the M2 layer is deposited thereon. The addition of this sculpting mask leveling (greyscale) allows for greater electrostatic destruct margin and greater operational space, which is also correlated to higher hinge memory lifetime.

Figure 10:
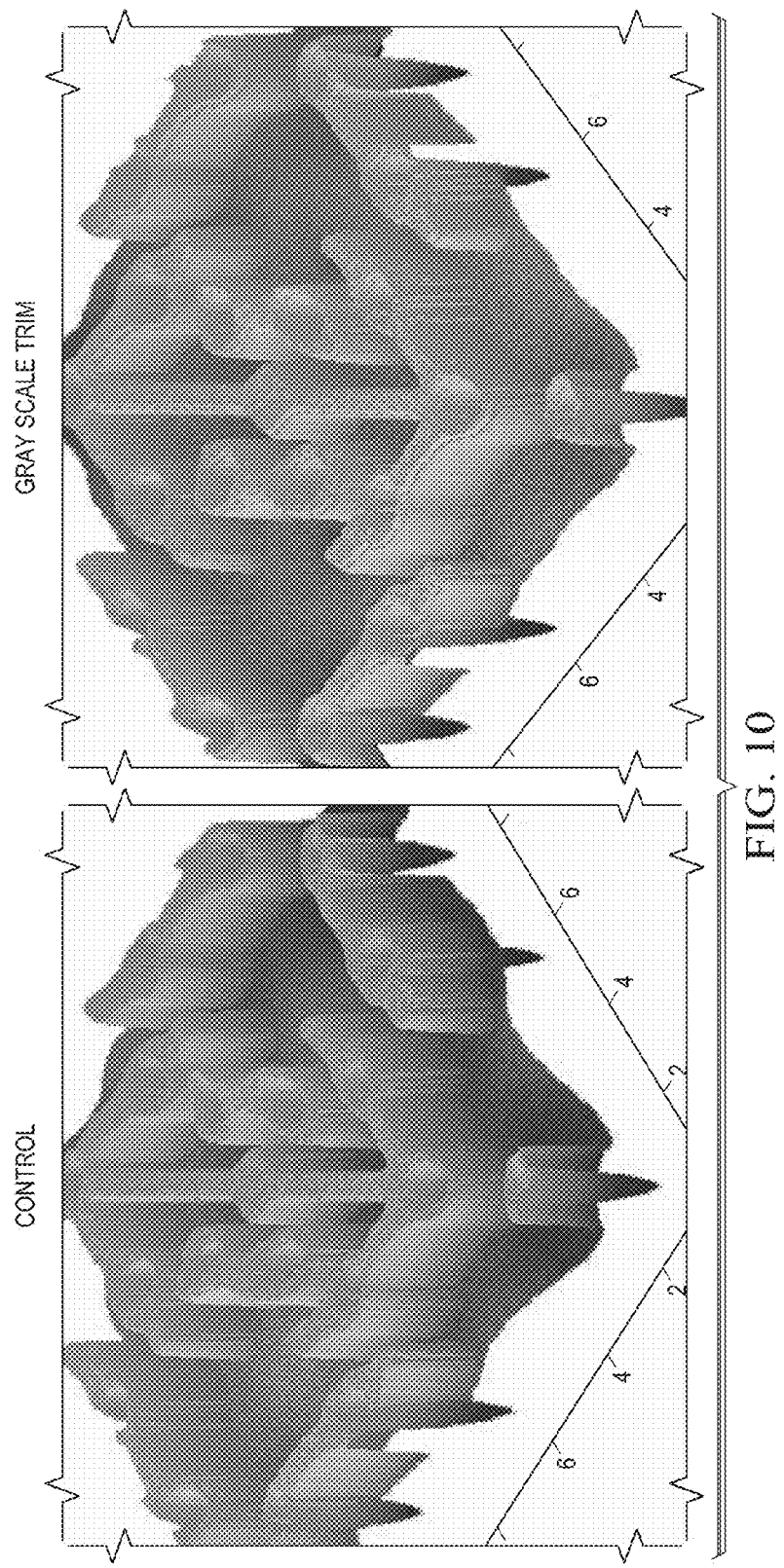
FIG. 10 illustrates atomic force microscopy (AFM) data showing a 50 nm topography reduction at the curl outward edge of the elevated address electrodes by using the gray-scale lithography masking process according to this disclosure.
Figure 12:
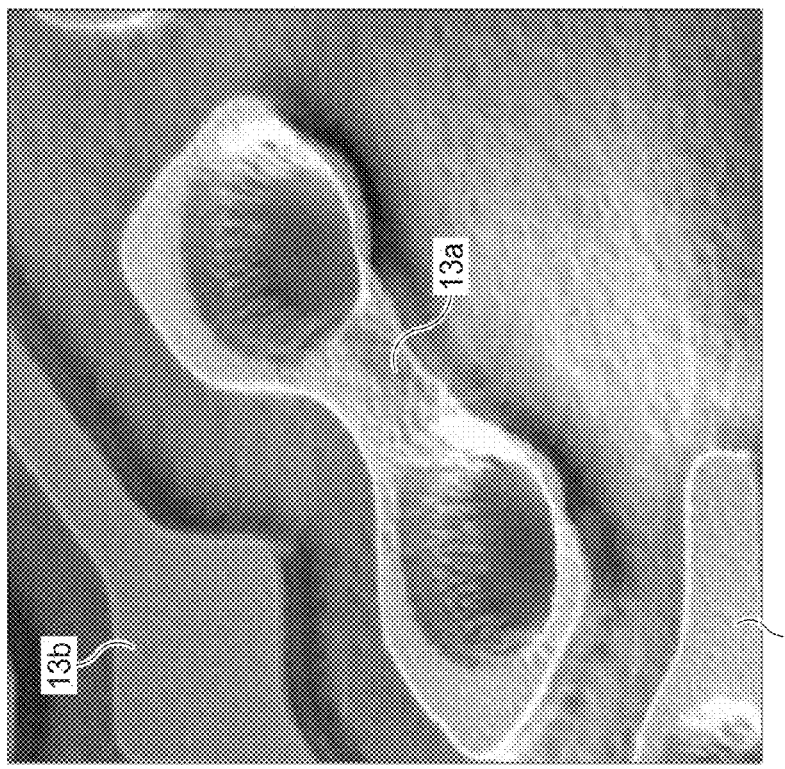
FIG. 12 illustrates post hinge etch shapes, illustrating the flat elevated address electrode and spring tips, which further improve the clearance distance with respect to the mirror after optimizing the center location of gray-scale mask layout.
Figure 11:
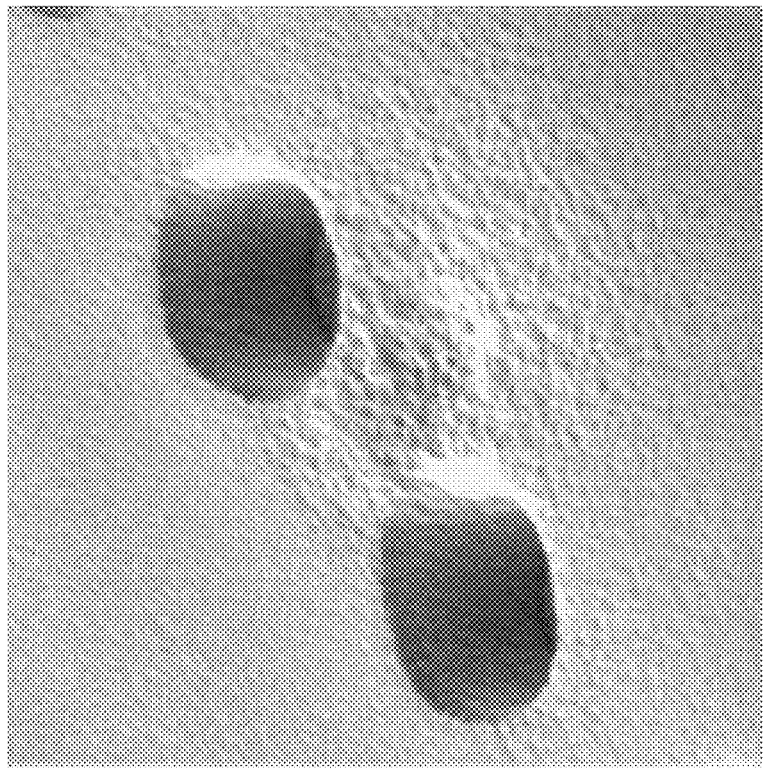
FIG. 11 shows tilt scanning electron microscope (SEM) images of the M2 layer representing post hinge deposition, before etching.

FIG. 10 illustrates atomic force microscopy (AFM) data showing a 50 nm topography reduction at the curl outward edge of the elevated address electrodes 13a by using the gray-scale lithography masking process according to this disclosure. FIG. 11 shows tilt scanning electron microscope (SEM) images of layer 13 representing post hinge deposition, before etching. As can be seen, layer 13 is substantially flat and without binge. FIG. 12 shows post hinge etch shapes, illustrating the flat elevated address electrode 13a and spring tips 13c, which further improve the clearance distance with respect to mirror 14a after optimizing the center location of gray-scale mask layout.

Referring to FIGS. 13-23, there is shown the fabrication process using the sub-wavelength grey-scale lithography masking process according to this disclosure to remove binge and planarize the elevated address electrodes 13a and the spring tips 13c.

Figure 13:
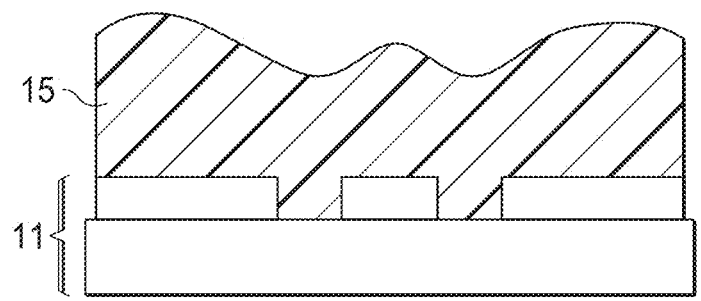
FIGS. 13-22 illustrate an example process according to this disclosure.

FIG. 13 illustrates the sacrificial photoresist deposition of spacer layer 15 upon the substrate 11 including the memory cells (also referred to as a carrier), illustrating the non-planar surface of spacer layer 15 conforming to the non-planar surface of substrate 11.

Figure 14:
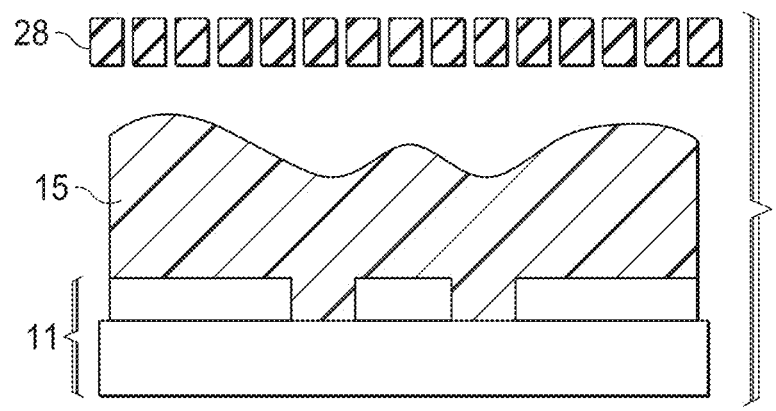

FIG. 14 illustrates exposing the photoresist of spacer layer 15 to a grey-scale mask 28 to remove hinging and other spatial variations from the surface of spacer layer 15.

Figure 15:
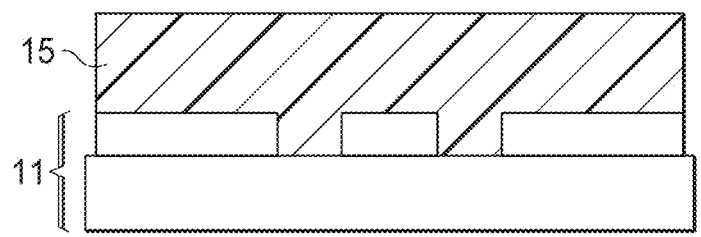

FIG. 15 illustrates developing and etching the photoresist of spacer layer 15 to realize the planarized upper surface of the spacer layer 15.

Figure 16:
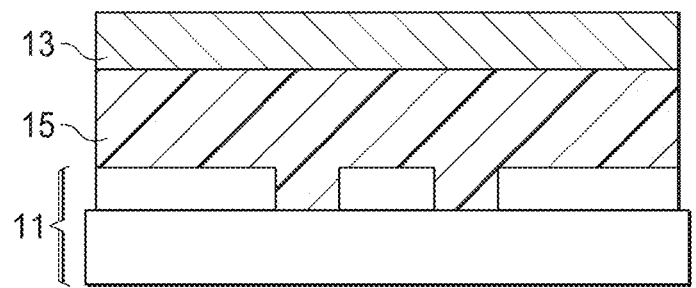

FIG. 16 illustrates a blanket deposition of M2 layer 13 over the spacer layer 15. The M2 layer 13 comprises a metal layer of aluminum or other material as desired. Advantageously, the M2 layer 13 conforms to the planarized spacer layer 15 and thus has a planar surface as well.

Figure 17:
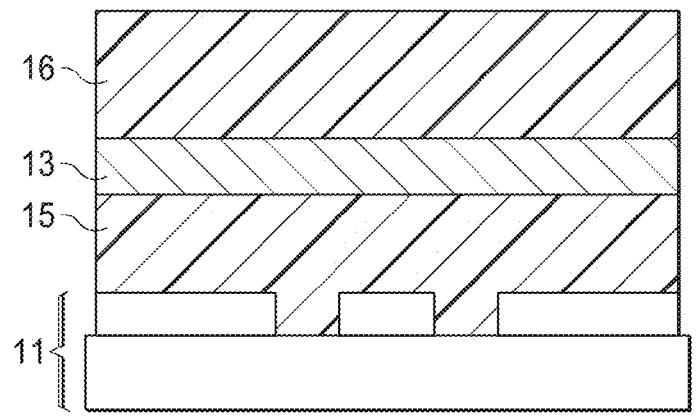

FIG. 17 illustrates the deposition of a pattern photoresist layer 16 over the M2 layer 13, which is also referred to as a pattern resist level.

Figure 18:
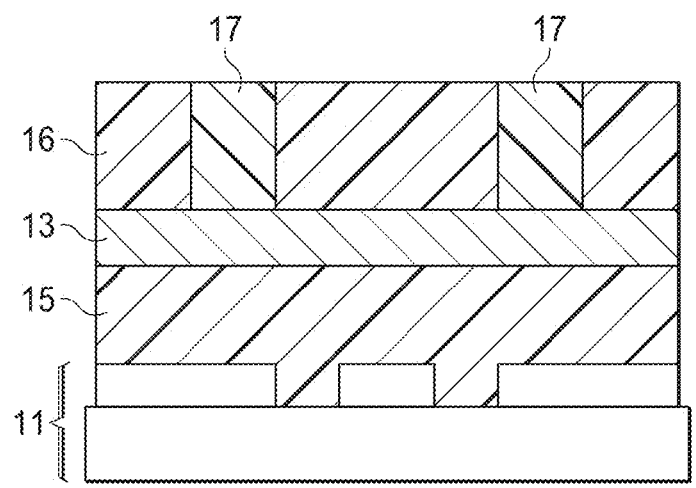

FIG. 18 illustrates exposing the photoresist of layer 16 to define a pattern 17 in the M2 layer 13, the pattern 17 corresponding to features to be created in M2 layer 13 such as the elevated address electrodes 13a, hinge 13b and spring tips 13c.

Figure 19:
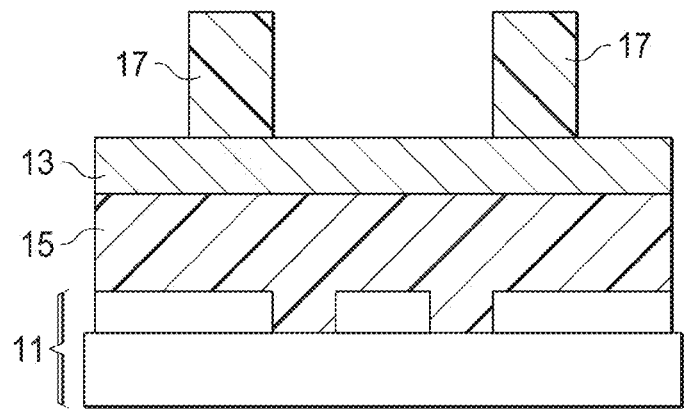

FIG. 19 illustrates developing and stripping the exposed layer 16 to produce the pattern 17.

Figure 20:
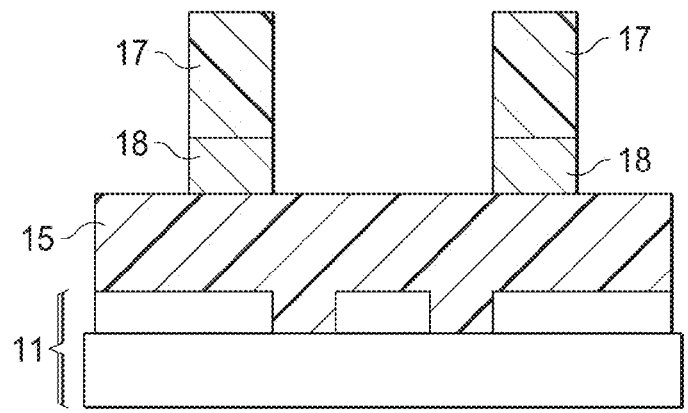

FIG. 20 illustrates etching the M2 layer 13 to define a pattern 18 in M2 layer 13 over the spacer layer 15.

Figure 21:
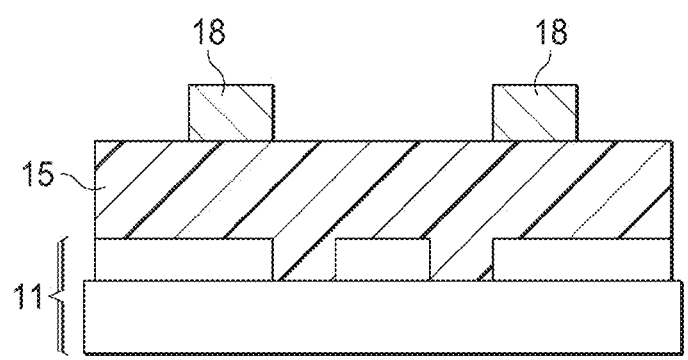

FIG. 21 illustrates removing the pattern 17 such that pattern 18 remains over the spacer layer 15.

Figure 22:
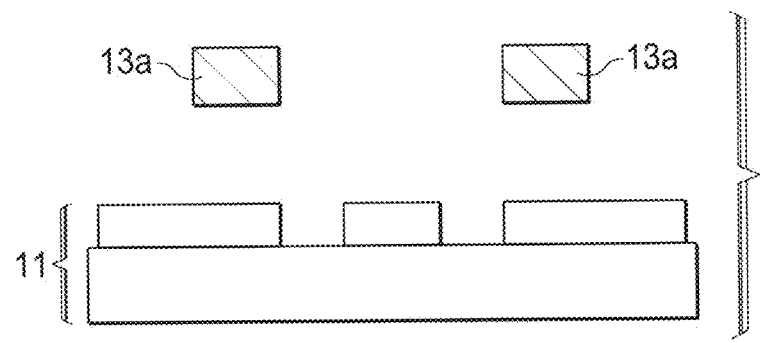

FIG. 22 illustrates removing the sacrificial spacer layer 15, resulting in the features of M2 layer 13, such as the elevated address electrodes 13a, hinge 13b and spring tips 13c spaced over the substrate 11 as shown in FIG. 1.

Figure 23:
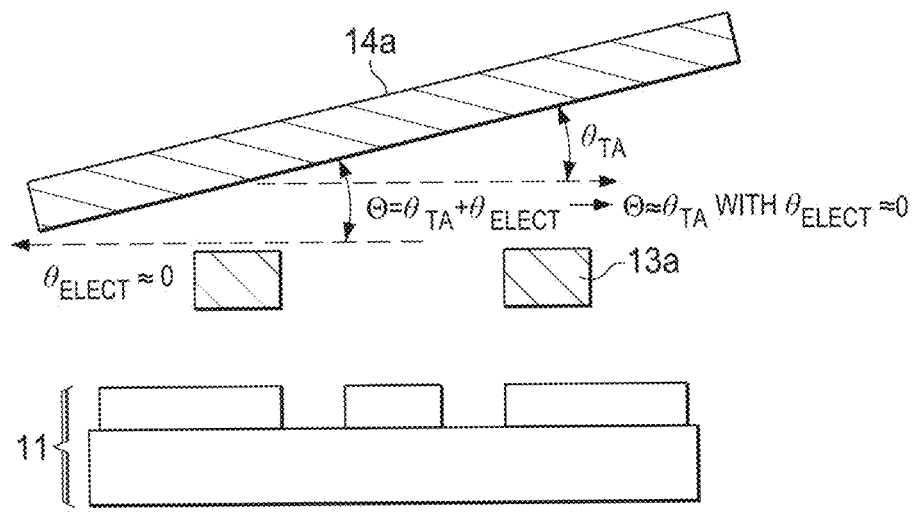
FIG. 23 illustrates the improved combined angle between the mirror and the elevated address electrodes.

FIG. 23 illustrates the combined angle between the mirror 14a and the flat elevated address electrodes 13a to about degrees. This advantageously improves sensitivity to the edges of elevated address electrodes 13a and improves the electrostatic torque delivery and thereby operation and margin of the pixel 10.

Although the figures have illustrated different circuits and operational examples, various changes may be made to the figures. For example, the spacer layer 15 can be exposed by the grey-scale masking to create other non-planar features in M2 layer 13, such as shaped address electrodes 13a. As a particular example, the address electrodes 13a may be shaped by the grey-scale masking process to create address electrodes 13a that are angled like a wedge to be parallel to the mirror 14a when the mirror 14a is tilted toward the address electrode 13a. Other layers can be exposed by the grey-scale masking, such as a spacer layer used to shape layer 14 and customize the shape of mirror 14a.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   depositing a photoresist spacer layer upon a non-planar upper surface of a substrate;
   exposing the photoresist spacer layer to a grey-scale lithographic mask to shape an upper surface of the photoresist spacer layer;
   forming a control member upon the shaped upper surface of the photoresist spacer layer;
   removing the photoresist spacer layer to form an air gap between the control member and the substrate; and
   forming a positionable image member over the control member, the image member: being positionable as a function of an electrostatic field distributed by the control member; and having a light reflective surface configured as part of a spatial light modulator to form at least a portion of an image by modulating incident light.

2. The method as specified in claim 1, wherein the upper surface of the photoresist spacer layer is planarized by exposing the photoresist spacer layer to the grey-scale lithographic mask.

3. The method as specified in claim 2, further comprising masking a selected portion of the photoresist spacer layer.

4. The method as specified in claim 3, further comprising removing undulations in the selected portion.

5. The method as specified in claim 2, wherein the image member is substantially parallel to the substrate.

6. The method as specified in claim 5, wherein the control member includes an electrode having an upper surface, and all of the upper surface of the electrode is substantially parallel to the substrate.

7. The method as specified in claim 1, wherein the substrate includes memory configured to control the electrostatic field distributed by the control member.

8. The method as specified in claim 1, wherein the light reflective surface is a light reflective upper surface of the image member.

9. The method as specified in claim 1, wherein the image member is formed on a torsion hinge.

10. The method as specified in claim 1, wherein the control member includes an electrode having an upper surface, and all of the upper surface of the electrode is substantially parallel to the substrate.

11. A method comprising:
    depositing a spacer layer upon a non-planar upper surface of a substrate;
    exposing the spacer layer to a grey-scale lithographic mask to remove undulations in an upper surface of the spacer layer;
    after the exposing, forming a control member upon the upper surface of the spacer layer;
    removing the spacer layer to form an air gap between the control member and the substrate; and
    forming a positionable image member over the control member, the image member: being positionable as a function of an electrostatic field distributed by the control member; and having a light reflective surface configured as part of a spatial light modulator to form at least a portion of an image by modulating incident light.

12. The method as specified in claim 11, wherein the upper surface of the spacer layer is planarized by exposing the spacer layer to the grey-scale lithographic mask.

13. The method as specified in claim 11, wherein the image member is substantially parallel to the substrate.

14. The method as specified in claim 11, wherein the substrate includes memory configured to control the electrostatic field distributed by the control member.

15. The method as specified in claim 11, wherein the light reflective surface is a light reflective upper surface of the image member.

16. The method as specified in claim 11, wherein the image member is formed on a torsion hinge.

17. The method as specified in claim 11, wherein the control member includes an electrode having an upper surface, and all of the upper surface of the electrode is substantially parallel to the substrate.

18. A method comprising:
    depositing a photoresist spacer layer upon a non-planar upper surface of a substrate including memory;
    exposing the photoresist spacer layer to a grey-scale lithographic mask to planarize an upper surface of the photoresist spacer layer;
    forming a control member upon the planarized upper surface of the photoresist spacer layer;
    removing the photoresist spacer layer to form an air gap between the control member and the substrate; and
    forming a positionable image member over the control member, the image member: being substantially parallel to the control member; and being positionable as a function of an electrostatic field distributed by the control member as a function of the memory; and having a light reflective surface configured as part of a spatial light modulator (SLM) to form at least a portion of an image by modulating incident light.

19. The method as specified in claim 18, wherein the control member includes an electrode having an upper surface, and all of the upper surface of the electrode is substantially parallel to the substrate.

20. The method as specified in claim 18, wherein the image member is formed on a torsion hinge, and wherein the light reflective surface is a light reflective upper surface of the image member.

* * * * *